United States Patent
Jeon

(10) Patent No.: US 10,916,301 B2
(45) Date of Patent: Feb. 9, 2021

(54) DATA STORAGE DEVICE AND OPERATING METHOD THEREOF

(71) Applicant: SK hynix Inc., Gyeonggi-do (KR)

(72) Inventor: Myeong Woon Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/584,344

(22) Filed: Sep. 26, 2019

(65) Prior Publication Data

US 2020/0020395 A1    Jan. 16, 2020

Related U.S. Application Data

(62) Division of application No. 15/265,949, filed on Sep. 15, 2016, now Pat. No. 10,468,097.

(30) Foreign Application Priority Data

Jun. 20, 2016    (KR) .......................... 10-2016-0076658

(51) Int. Cl.
| | |
|---|---|
| *G11C 11/56* | (2006.01) |
| *G11C 16/30* | (2006.01) |
| *G11C 16/28* | (2006.01) |

(52) U.S. Cl.
CPC .......... *G11C 11/5642* (2013.01); *G11C 16/28* (2013.01); *G11C 16/30* (2013.01); *G11C 2211/5634* (2013.01)

(58) Field of Classification Search
CPC ..... G11C 11/5642; G11C 11/28; G11C 11/30; G11C 2211/5634

USPC ..................................................... 365/189.15
See application file for complete search history.

(56) References Cited

U.S. PATENT DOCUMENTS

| | | | | |
|---|---|---|---|---|
| 9,524,790 | B1* | 12/2016 | Steiner | G11C 16/28 |
| 2011/0072191 | A1* | 3/2011 | Huang | G11C 16/10 |
| | | | | 711/103 |
| 2012/0110401 | A1* | 5/2012 | Ryu | G11C 11/5628 |
| | | | | 714/721 |
| 2013/0094290 | A1* | 4/2013 | Sridharan | G11C 16/28 |
| | | | | 365/185.03 |
| 2014/0026003 | A1 | 1/2014 | Chen et al. | |
| 2014/0047168 | A1* | 2/2014 | Kim | G06F 12/0246 |
| | | | | 711/103 |
| 2014/0136765 | A1* | 5/2014 | Oh | G11C 11/5642 |
| | | | | 711/103 |
| 2014/0153330 | A1* | 6/2014 | Yoon | G11C 16/0483 |
| | | | | 365/185.03 |

(Continued)

FOREIGN PATENT DOCUMENTS

| | | |
|---|---|---|
| CN | 103985415 | 8/2014 |
| WO | 2014/113726 | 7/2014 |

OTHER PUBLICATIONS

Office Action issued by the Taiwan Intellectual Property Office dated Dec. 26, 2019.

*Primary Examiner* — Sung Il Cho
(74) *Attorney, Agent, or Firm* — IP & T Group LLP

(57) ABSTRACT

A method for operating a data storage device includes determining appropriateness of a first read bias for adjacent target threshold voltage distributions among threshold voltage distributions for a plurality of memory cells; and if it is determined that the first read bias is inappropriate, determining a second read bias.

11 Claims, 13 Drawing Sheets

(56) References Cited

U.S. PATENT DOCUMENTS

| | | | |
|---|---|---|---|
| 2014/0198569 A1* | 7/2014 | Kim | G11C 16/28 |
| | | | 365/185.03 |
| 2014/0269045 A1* | 9/2014 | Chu | G11C 13/0004 |
| | | | 365/163 |
| 2014/0281803 A1* | 9/2014 | Hsueh | G06F 11/1048 |
| | | | 714/763 |
| 2015/0006983 A1* | 1/2015 | Lin | G11C 16/26 |
| | | | 714/721 |
| 2015/0043282 A1* | 2/2015 | Shin | G11C 11/5642 |
| | | | 365/185.21 |
| 2015/0049548 A1* | 2/2015 | Park | G11C 16/349 |
| | | | 365/185.11 |
| 2015/0113322 A1* | 4/2015 | Lee | G11C 29/021 |
| | | | 714/15 |
| 2015/0220389 A1* | 8/2015 | Kim | H03M 13/3746 |
| | | | 714/764 |
| 2016/0034349 A1* | 2/2016 | Choi | G11C 11/5642 |
| | | | 714/764 |
| 2016/0225439 A1* | 8/2016 | Kim | G11C 11/5635 |
| 2016/0225440 A1* | 8/2016 | Han | G11C 11/5642 |
| 2016/0266970 A1* | 9/2016 | Amaki | G06F 3/0679 |
| 2016/0276040 A1* | 9/2016 | Han | G11C 16/08 |
| 2017/0125110 A1* | 5/2017 | Sankaranarayanan | G11C 16/26 |
| 2017/0125116 A1* | 5/2017 | Shim | G11C 16/08 |
| 2017/0133087 A1* | 5/2017 | Park | G11C 11/5671 |
| 2017/0200505 A1* | 7/2017 | Jin | G11C 16/28 |
| 2017/0235633 A1* | 8/2017 | Park | G06F 11/1048 |
| | | | 714/764 |

* cited by examiner

| P_FVB | 0.005 | 0.01 | 0.015 | 0.02 | 0.025 | 0.03 | 0.035 | 0.04 |
|---|---|---|---|---|---|---|---|---|
| Q⁻¹ | 2.5758 | 2.3263 | 2.1701 | 2.0537 | 1.9600 | 1.8808 | 1.8119 | 1.7507 |
| P_FVB | 0.045 | 0.05 | 0.07 | 0.09 | 0.11 | 0.13 | 0.15 | 0.17 |
| Q⁻¹ | 1.6954 | 1.6449 | 1.4758 | 1.3408 | 1.2265 | 1.1264 | 1.0364 | 0.9542 |
| P_FVB | 0.19 | 0.21 | 0.23 | 0.25 | 0.27 | 0.29 | 0.31 | 0.33 |
| Q⁻¹ | 0.8779 | 0.8064 | 0.7388 | 0.6745 | 0.6128 | 0.5534 | 0.4959 | 0.4399 |
| P_FVB | 0.35 | 0.37 | 0.39 | 0.41 | 0.43 | 0.45 | 0.47 | 0.49 |
| Q⁻¹ | 0.3853 | 0.3319 | 0.2793 | 0.2275 | 0.1764 | 0.1257 | 0.0753 | 0.0251 |

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0076658, filed on Jun. 20, 2016, in the Korean Intellectual Property Office, which is incorporated herein by reference in its entirety.

BACKGROUND

1. Technical Field

Various embodiments relate generally to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

SUMMARY

In an embodiment, a method for operating a data storage device may include: determining appropriateness of a first read bias for adjacent target threshold voltage distributions among threshold voltage distributions for a plurality of memory cells; and if it is determined that the first read bias is inappropriate, determining a second read bias.

In an embodiment, a method for operating a data storage device may include: determining appropriateness of a first read bias for adjacent target threshold voltage distributions among threshold voltage distributions for a plurality of memory cells; if it is determined that the first read bias is inappropriate, determining a start bias corresponding to the target threshold voltage distributions, based on a Gaussian modeling algorithm and an error rate of the first read bias; and determining a second read bias based on the start bias.

In an embodiment, a method for operating a data storage device may include: determining a start bias corresponding to adjacent target threshold voltage distributions among threshold voltage distributions of a plurality of memory cells, based on a Gaussian modeling algorithm and a first read bias; and determining a second read bias for the target threshold voltage distributions, based on the start bias.

In an embodiment, a data storage device may include: an appropriateness determination unit suitable for determining appropriateness of a first read bias for adjacent target threshold voltage distributions among threshold voltage distributions for a plurality of memory cells in a memory device; and a read bias determination unit suitable for determining a second read bias if it is determined that the first read bias is inappropriate.

In an embodiment, the appropriateness determination unit is suitable for determining a number of memory cells which have threshold voltages lower than the first read bias, among the plurality of memory cells; and determining the appropriateness of the first read bias based on the number of memory cells and a reference number corresponding to the target threshold voltage distributions.

In an embodiment, the appropriateness determination unit is suitable for obtaining data read from the memory cells based on the first read bias; and determining a number of bits having a predetermined value, included in the data.

In an embodiment, the read bias determination unit is suitable for determining the second read bias based on a gradient descent algorithm.

In an embodiment, the read bias determination unit is suitable for determining an average threshold voltage of a first target threshold voltage distribution of the target threshold voltage distributions, based on a Gaussian distribution function; and determining the second read bias based on the average threshold voltage and an estimated width of the first target threshold voltage distribution.

In an embodiment, the read bias determination unit is suitable for determining the average threshold voltage by determining an area rate of a partial distribution formed by the first read bias in the first target threshold voltage distribution and applying the area rate to an integral equation for the Gaussian distribution function.

In an embodiment, the read bias determination unit is suitable for determining the average threshold voltage by determining an area rate of a partial distribution formed by the first read bias in the first target threshold voltage distribution and applying the area rate to an inverse function of a Q function.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
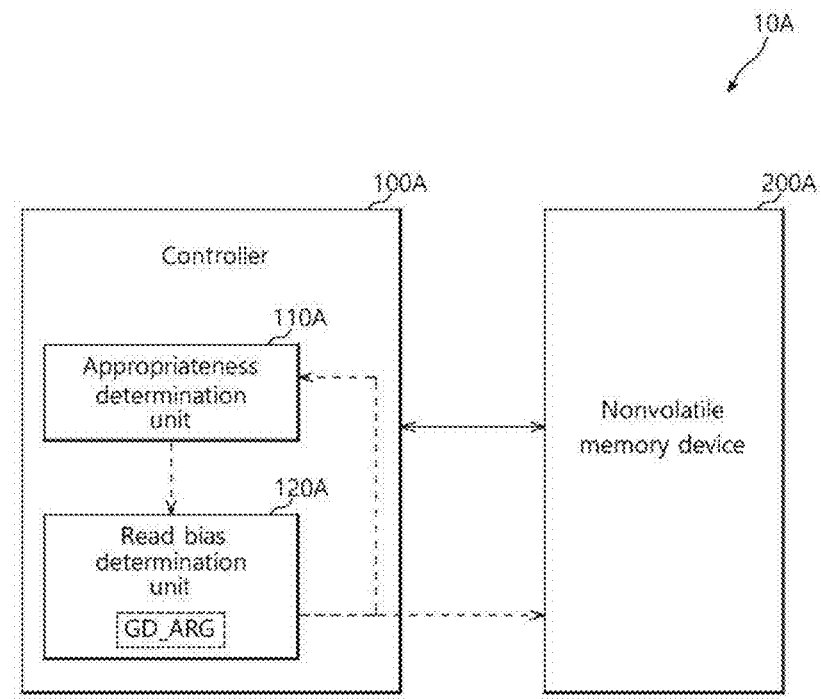
FIG. 1 is a block diagram illustrating a data storage device in accordance with an embodiment of the present invention.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in sufficient detail so that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be also understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

As used herein, singular forms are intended to include the plural forms as well, unless the context clearly indicates otherwise. Also, the terms "comprises", "comprising", "includes", "including" and the like when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the art to which this invention pertains, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 illustrates a data storage device 10A, in accordance with an embodiment of the present invention.

Referring to FIG. 1, the data storage device 10A may be configured to store data provided from an external device (not shown), in response to a write request from the external device. Also, the data storage device 10A may be configured to provide stored data to the external device, in response to a read request from the external device. The external device may be a host device coupled to the storage device.

The data storage device 10A may be configured by a Personal Computer Memory Card International Association (PCMCIA) card, a Compact Flash (CF) card, a smart media card, a memory stick, various multimedia cards (e.g., MMC, eMMC, RS-MMC, and MMC-Micro), various secure digital cards (e.g., SD, Mini-SD, and Micro-SD), a Universal Flash Storage (UFS), a Solid State Drive (SSD) and the like.

The data storage device 10A may include a controller 100A and a nonvolatile memory device 200A.

The controller 100A may control the general operations of the data storage device 10A. The controller 100A may store data in the nonvolatile memory device 200A in response to a write request received from the external device. Also, the controller 100A may read data stored in the nonvolatile memory device 200A and output the read data to the external device in response to a read request received from the external device.

The controller 100A may include an appropriateness determination unit 110A and a read bias determination unit 120A.

The appropriateness determination unit 110A may determine appropriateness of a target read bias for target threshold voltage distributions. The target read bias may be a read bias which is being used by the nonvolatile memory device 200A for a read operation. That is to say, the appropriateness determination unit 110A may determine appropriateness of a read bias which is being used currently. Also, according to an embodiment, the target read bias may be a read bias to be used subsequently by the nonvolatile memory device 200A for a read operation. For example, the target read bias may be a new read bias which is determined by the read bias determination unit 120A. Before an erroneously determined read bias is used in a read operation, the appropriateness determination unit 110A may determine in advance appropriateness of a new read bias.

The nonvolatile memory device 200A may use a plurality of read biases in a read operation depending on the number of bits stored in each memory cell. A target read bias may be at least one among the plurality of read biases. An appropriateness determination operation may be performed for each read bias which is selected as a target read bias among a plurality of read biases.

When a target read bias is selected, it is determined whether or not it is appropriate in respect to target threshold voltage distributions. The target threshold voltage distributions may be determined in correspondence to the target read bias. For example, the target threshold voltage distributions may be a set of threshold voltage distributions which are adjacent to each other, among the threshold voltage distributions of memory cells. The target threshold voltage distributions may be a pair of adjacent threshold voltage distributions which are to be distinguished by the selected target read bias. Namely, in the present embodiment, an appropriateness determination operation may include determining whether a selected target read bias is appropriately positioned between a pair of adjacent target threshold voltage distributions for distinguishing the adjacent target threshold voltage distributions.

In more detail, the appropriateness determination unit 110A may perform an appropriateness determination operation. An appropriateness determination operation may include calculating an error rate of the selected target read bias, comparing the calculated error rate with an acceptable error rate range for an optimal read bias for the target threshold voltage distributions, and determining whether the error rate for the target read bias lies within the acceptable error range for the optimal read bias. An optimal read bias may be a voltage level corresponding to a point within a valley formed between a pair of adjacent target threshold voltage distributions. A valley formed between a pair of adjacent target threshold voltage distributions may be defined as a range of voltages between the lowest voltage point of the higher target threshold voltage distribution and the highest voltage point of the lower target threshold voltage distribution. For example, an optimal read bias may be a voltage level corresponding to a middle point of the valley between the adjacent target threshold voltage distributions, i.e., a voltage point lying between the lowest voltage point of the higher target threshold voltage distribution and the highest voltage point of the lower target threshold voltage distribution. A target read bias may be determined to be appropriate, when its calculated error rate lies within an acceptable error range (also referred to hereinafter as a tolerance range) for an optimal read bias for the adjacent target threshold voltage distributions. However, a target read bias for two adjacent target threshold voltage distributions may be determined to be inappropriate, when its calculated error rate does not lie within a tolerance range for the optimal read bias for the two adjacent target threshold voltage distributions.

In a variation of this embodiment, an appropriateness determination operation may include comparing a target read bias for two adjacent target threshold voltage distributions with a tolerance range of an optimal read bias of the target threshold voltage distributions, and determining whether the target read bias lies within the tolerance range for the optimal read bias. An optimal read bias may be a voltage level corresponding to a voltage within the valley formed between the adjacent target threshold voltage distributions, for example a middle point within the valley. A target read bias may be determined to be appropriate, when it falls within the tolerance range for the optimal read bias for the adjacent target threshold voltage distributions. However, a target read bias may be determined to be inappropriate, when it falls outside the tolerance range for the optimal read bias for the two adjacent target threshold voltage distributions. The tolerance range for an optimal target bias may be a preset range. The tolerance range for an optimal target bias may be based on estimated error rates occurring as a target read voltage deviates from the optimal target read voltage.

A selected target read bias which is determined to be appropriate may then be used subsequently in the read operation of the nonvolatile memory device 200A. By contrast, a selected target read bias which is not found to be appropriate may not be used in the read operation of the nonvolatile memory device 200A and accordingly the read bias determination unit 120A may determine a new target read bias.

In some embodiments, in order to determine a new target read bias for target threshold voltage distributions, the read bias determination unit 120A may perform a read bias determination operation which may include employing a gradient descent algorithm GD_ARG. A detailed description for the gradient descent algorithm GD_ARG will be made later. As described above, a new target read bias determined by the read bias determination unit 120A may be checked by the appropriateness determination unit 110A to determine whether or not it is appropriated for the target threshold voltage distributions.

The controller 100A may control the nonvolatile memory device 200A to perform a read operation based on a read bias determined, by the appropriateness determination unit 110A, to be appropriate.

The nonvolatile memory device 200A may store data received from the controller 100A and may read stored data and transmit read data to the controller 100A, according to control of the controller 100A. The nonvolatile memory device 200A may perform a read operation based on a read bias determined by the controller 100A.

The nonvolatile memory device 200A may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated in FIG. 1 that the data storage device 10A includes one nonvolatile memory device 200A, we note that the embodiment is not limited in this way. For example, more than one memory devices may be employed without departing from the scope of the present invention.

Figure 2:
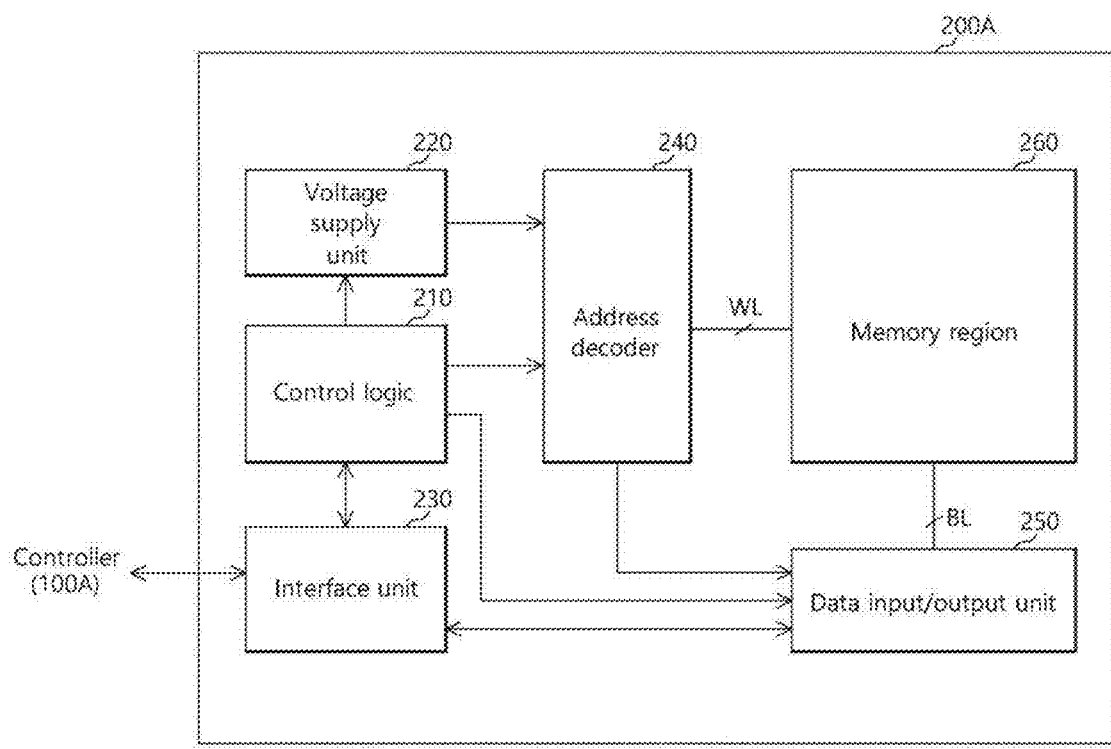
FIG. 2 is a block diagram illustrating an example of a detailed configuration of the nonvolatile memory device shown in FIG. 1.

FIG. 2 illustrates a configuration example for the nonvolatile memory device 200A shown in FIG. 1.

Referring to FIG. 2, the nonvolatile memory device 200A may include a control logic 210, a voltage supply unit 220, an interface unit 230, an address decoder 240, a data input/output unit 250, and a memory region 260.

The control logic 210 may control the general operations of the nonvolatile memory device 200A according to control of the controller 100A. The control logic 210 may receive a command from the controller 100A, through the interface unit 230, and may transmit control signals to internal units of the nonvolatile memory device 200A in response to the received command. A command may be any of a number of commands including, for example, a read or a write command.

The voltage supply unit 220 may generate various operation voltages necessary for performing the operations of the nonvolatile memory device 200A, according to control of the control logic 210. For example, the voltage supply unit 220 may supply a read bias to the address decoder 240 to be used in a read operation in response to a received read command.

The interface unit 230 may exchange various control signals including commands and addresses and data (e.g. user data, or metadata) with the controller 100A. The interface unit 230 may transmit various control signals and data inputted thereto, to the control logic 210 and also to other internal units of the nonvolatile memory device 200A.

The address decoder 240 may decode an address to select a portion to be accessed in the memory region 260. The address decoder 240 may apply a read bias to a word line selected among word lines WL according to a decoding result. The address decoder 240 may control the data input/output unit 250 to selectively drive bit lines BL.

The data input/output unit 250 may transmit data received from the interface unit 230, to the memory region 260 through the bit lines BL. The data input/output unit 250 may transmit data read from the memory region 260 through the bit lines BL, to the interface unit 230. The data input/output unit 250 may sense current formed as memory cells included in the memory region 260 are turned on and off in response to a read bias, and may obtain data read out from the memory cells, according to sensing results.

The memory region 260 may be coupled with the address decoder 240 through the word lines WL, and may be coupled with the data input/output unit 250 through the bit lines BL. The memory region 260 may include a plurality of memory cells which are respectively disposed at areas where the word lines WL and the bit lines BL intersect with each other and in which data are stored. The memory region 260 may include a memory cell array of a two-dimensional or three-dimensional structure.

Figure 3A:
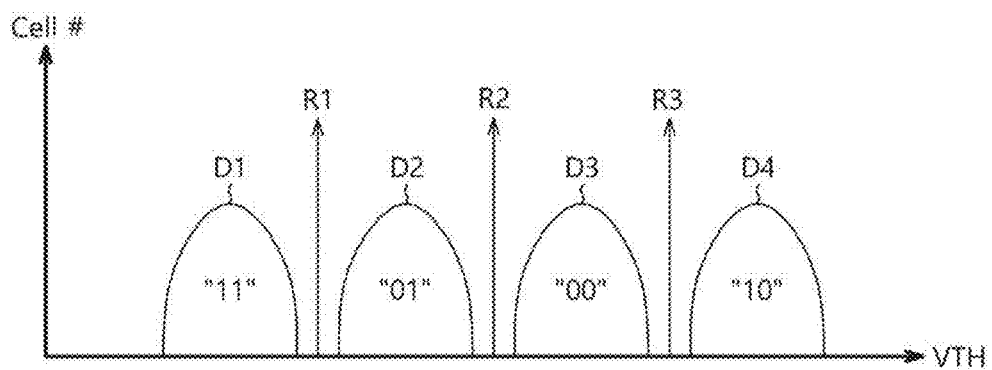
FIG. 3A is a diagram illustrating an example of threshold voltage distributions of memory cells.

FIG. 3A is a diagram illustrating an example of threshold voltage distributions D1 to D4 of memory cells. The horizontal axis VTH represents threshold voltages of memory cells. The vertical axis Cell # represent the number of memory cells corresponding to a threshold voltage. Memory cells which form the threshold voltage distributions D1 to D4 may be memory cells which are coupled to a single word line.

Referring to FIG. 3A, memory cells may form the threshold voltage distributions D1 to D4 according to data stored therein. A memory cell may be controlled to have a threshold voltage corresponding to any one among the 4 threshold voltage distributions D1 to D4 when each memory cell may store 2-bit data therein, when a write operation is performed. For example, a memory cell stored with data "11" may have a threshold voltage corresponding to the threshold voltage distribution D1, a memory cell stored with data "01" may have a threshold voltage corresponding to the threshold voltage distribution D2, a memory cell stored with data "00" may have a threshold voltage corresponding to the threshold voltage distribution D3, and a memory cell stored with data "10" may have a threshold voltage corresponding to the threshold voltage distribution D4. While FIG. 3A illustrates that 2-bit data is stored in a memory cell, we note that the present embodiment is not limited thereto. For example, each memory cell may store 3, or more bit data without departing from the scope of the present invention.

A memory cell may retain a turned-on state or a turned-off state according to the threshold voltage thereof, when it is applied with a predetermined read bias through a corresponding word line. For example, a memory cell may be turned on when a read bias higher than its threshold voltage is applied thereto, and may retain a turned-off state when a read bias lower than its threshold voltage is applied thereto. As a memory cell is turned on or off, current may be formed in a corresponding bit line. By sensing corresponding current, it is possible to determine whether the threshold voltage of a memory cell is higher or lower than a read bias applied thereto. By this principle, when a read operation is performed, read biases R1 to R3 may be applied to memory cells to distinguish the threshold voltage distributions D1 to D4 of the memory cells. By determining a threshold voltage distribution in which a memory cell is positioned, the data stored in the memory cell may be obtained.

Figure 3B:
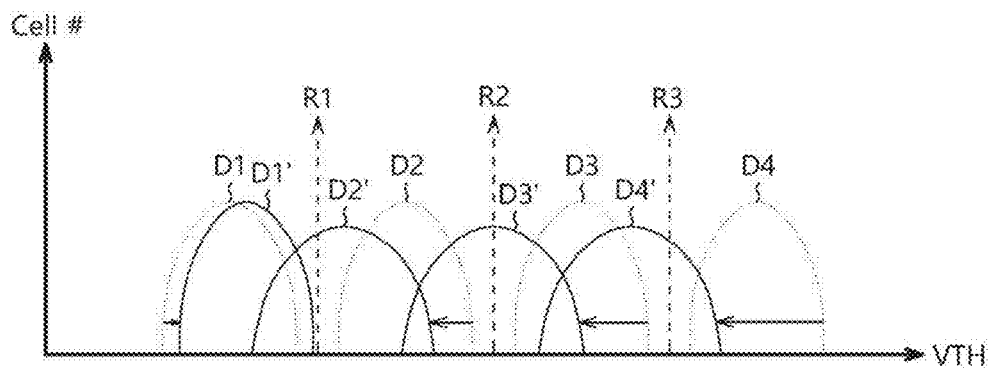
FIG. 3B is a diagram illustrating an example of movements of threshold voltage distributions.

FIG. 3B is a diagram illustrating an example of movements of the threshold voltage distributions D1 to D4.

Referring to FIG. 3B, the threshold voltages of memory cells may change, hence, the threshold voltage distributions D1 to D4 may move or shift to form new threshold voltage distributions D1' to D4'. For example, changes in the threshold voltages of memory cells may be caused by interference between adjacent memory cells, discharge due to elapse of time, etc.

When the shift of the threshold voltage distributions is substantial, the previous read biases R1 to R3 may become inappropriate to distinguish the threshold voltage distributions D1' to D4'. For example, when the shift of the new threshold voltage distributions D1' to D4' is substantial, the data read from the memory cells based on the read biases R1 to R3 may include error bits that may exceed the error correction capability of the controller 100A. That is to say, a read operation using the read biases R1 to R3 may fail.

Figure 3C:
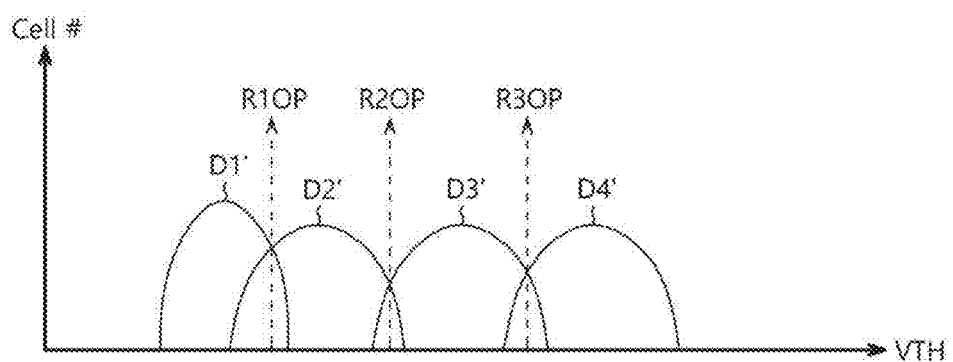
FIG. 3C is a diagram illustrating an example of optimal read biases for threshold voltage distributions.

FIG. 3C is a diagram illustrating an example of optimal read biases R1OP to R3OP for the threshold voltage distributions D1' to D4'.

Referring to FIG. 3C, each of the optimal read biases R1OP to R3OP may be positioned at a point within a valley formed between two adjacent threshold voltage distributions among the moved threshold voltage distributions D1' to D4'. The optimal read biases R1OP to R3OP may be read biases which cause the data read from the memory cells forming the threshold voltage distributions D1' to D4' to include minimal error bits. As illustrated in FIG. 3C, adjacent threshold voltage distributions may intersect one another. Also as illustrated in FIG. 3C, an optimal read bias may lie at the intersection point between two adjacent threshold voltage distributions. However, we note that this is just an example and depending on the shape of the adjacent threshold voltage distributions an optimal read voltage may differ.

When memory cells form the threshold voltage distributions D1' to D4', the data read from the memory cells based on the optimal read biases R1OP to R3OP may include error bits within the error correction capability of the controller 100A. That is to say, a read operation using the optimal read biases R1OP to R3OP may succeed.

Referring back to FIG. 1, the read bias determination unit 120A may perform read bias determination operations to determine the optimal read biases R1OP to R3OP as new read biases, in the case where the threshold voltage distributions D1 to D4 move to the threshold voltage distributions D1' to D4'.

Figure 3D:
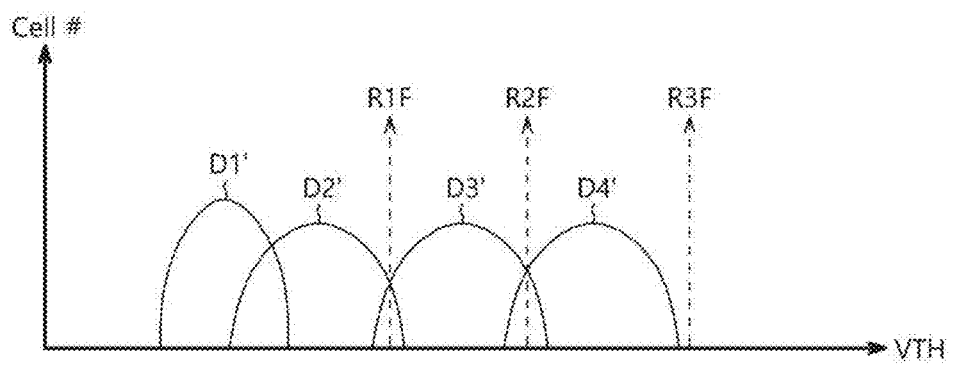
FIG. 3D is a diagram illustrating an example of read bias determination operations that malfunctioned for threshold voltage distributions.

FIG. 3D is a diagram illustrating an example of read bias determination operations that malfunctioned for the threshold voltage distributions D1' to D4'.

Referring to FIG. 3D, by malfunction of read bias determination operations, new read biases R1F to R3F may be determined for the threshold voltage distributions D1' to D4'. Such malfunction of read bias determination operations may be caused as the gradient descent algorithm GD_ARG malfunctions as will be described later. The new read biases R1F to R3F may be inappropriate for performing a read operation since they do not distinguish all the threshold voltage distributions D1' to D4'. Therefore, a read operation based on the new read biases R1F to R3F may fail.

According to the present embodiment, the appropriateness determination unit 110A may efficiently determine, through a simple method, appropriateness of a read bias which is being used currently or a read bias which is determined by the read bias determination unit 120A.

Figure 4A:
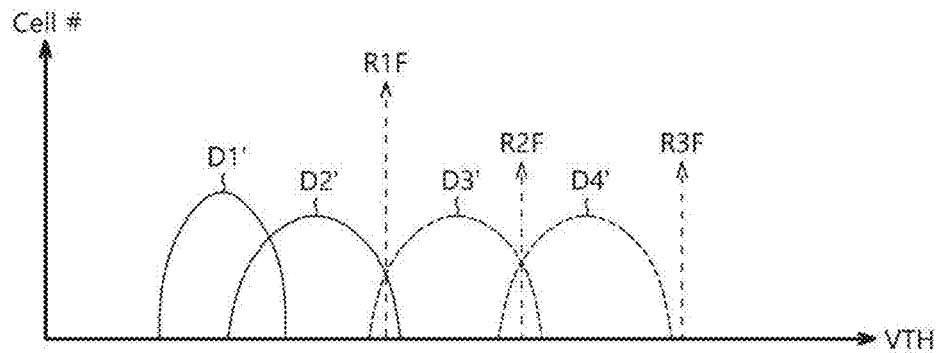
FIGS. 4A to 4C are diagrams illustrating examples of a method for the appropriateness determination unit of FIG. 1 to determine a target read bias and target threshold voltage distributions.
Figure 4B:
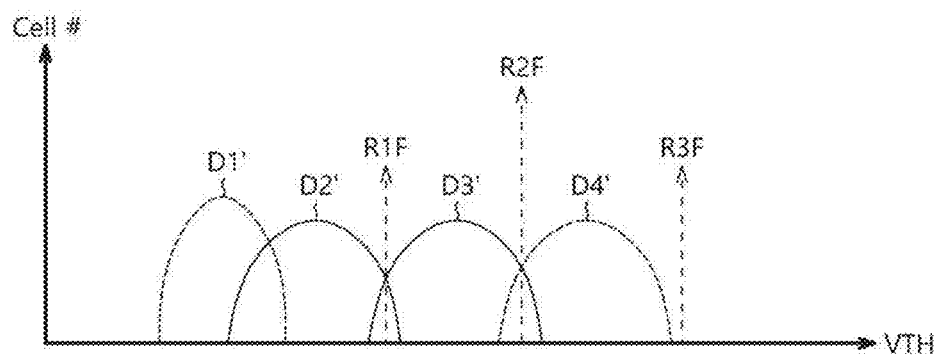
Figure 4C:
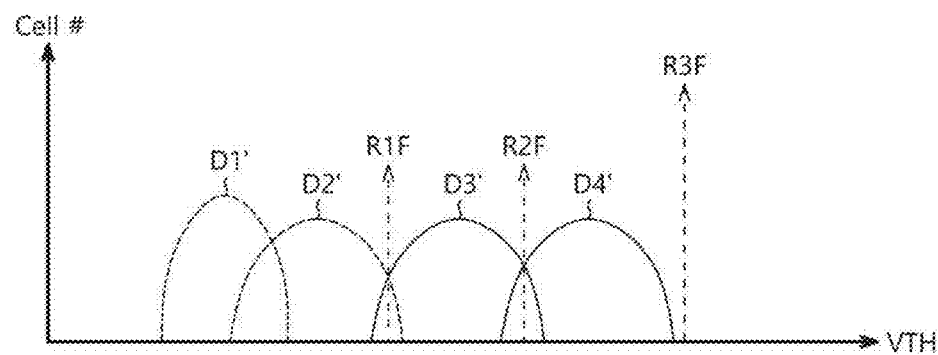

FIGS. 4A to 4C are diagrams illustrating examples of a method for the appropriateness determination unit 110A of FIG. 1 to determine a target read bias and target threshold voltage distributions. FIGS. 4A to 4C illustrate a method of determining a target read bias and target threshold voltage distributions in a situation where the read biases R1F to R3F are erroneously determined for the threshold voltage distributions D1' to D4' by a malfunctioning read bias determination operations.

Referring to FIG. 4A, the appropriateness determination unit 110A may select the read bias R1F as a target read bias. Since the target read bias R1F will be used to distinguish the threshold voltage distributions D1' and D2' in a read operation, the threshold voltage distributions D1' and D2' are determined as the target threshold voltage distributions for the selected read bias R1F.

Referring to FIG. 4B, the appropriateness determination unit 110A may then select the read bias R2F as a target read bias. Since the target read bias R2F will be used to distinguish the threshold voltage distributions D2' and D3' in the read operation, the threshold voltage distributions D2' and D3' are determined as the target threshold voltage distributions for the selected read bias R2F.

Referring to FIG. 4C, the appropriateness determination unit 110A may select the read bias R3F as a target read bias. Since the target read bias R3F will be used to distinguish the threshold voltage distributions D3' and D4' in the read operation, the threshold voltage distributions D3' and D4' are determined as the target threshold voltage distributions for the selected read bias R3F.

Summarizing these, the appropriateness determination unit 110A may determine target threshold voltage distributions corresponding to a target read bias, based on the sequences of the read biases R1F to R3F and the threshold voltage distributions D1' to D4'.

Figure 5:
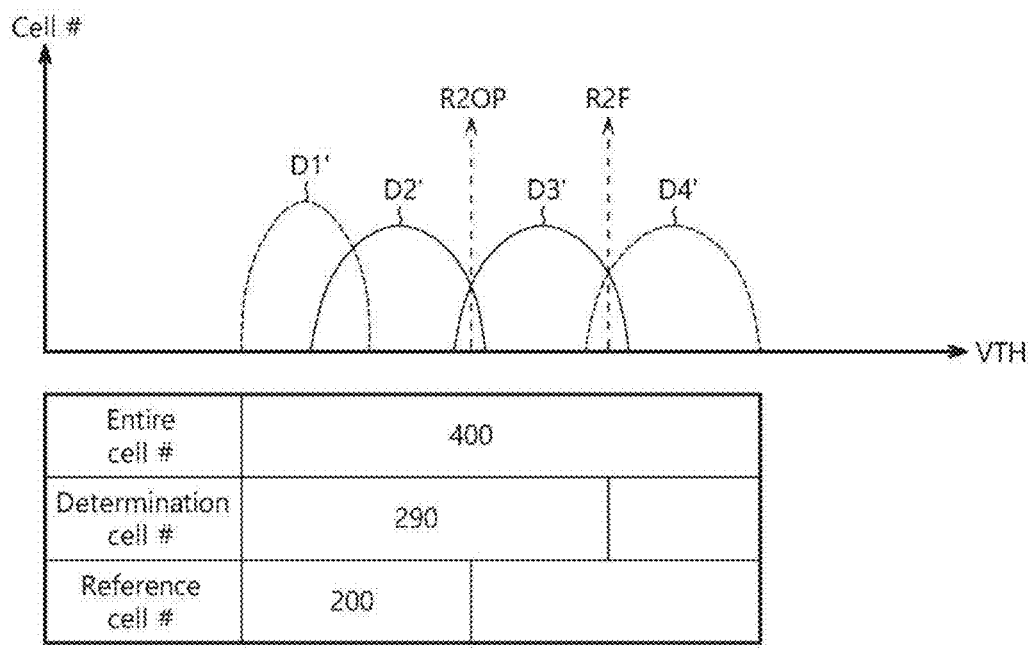
FIG. 5 is a diagram illustrating an operating method of the appropriateness determination unit of FIG. 1.

FIG. 5 is a diagram illustrating an operating method of the appropriateness determination unit 110A of FIG. 1. In FIG. 5, as an example, it is provided, that the appropriateness determination unit 110A determines whether the target read bias R2F of FIG. 4B is appropriate for the target threshold voltage distributions D2' and D3'.

Referring to FIG. 5, first, the appropriateness determination unit 110A determines the number of target memory cells which have threshold voltages lower than the target read bias R2F, referred to hereinafter as the "determination cell number" and shown in FIG. 5 as the "determination cell #". The appropriateness determination unit 110A may determine the number of target memory cells which are turned on when the target read bias R2F is applied to target memory cells, as the determination cell number. The appropriateness determination unit 110A may determine the determination cell number by obtaining data read from target memory cells when the target read bias R2F is applied to target memory cells and counting the number of predetermined values (for example, "1") from the obtained data. For example, as illustrated in FIG. 5, the determination cell number (i.e., determination cell #) may be 290 out of an entire cell number (i.e., entire cell #) for all the target memory cells of 400.

The appropriateness determination unit 110A may also determine the number of reference cells, hereinafter referred to as the reference cell number (in FIG. 5 illustrated as the "reference cell #"). The reference cell number may be the number of target memory cells which are estimated to have threshold voltages lower than the optimal read bias R2OP, when the respective numbers of memory cells corresponding to the threshold voltage distributions D1' to D4' are equal to one another. In other words, the reference cell number may be the number of target memory cells which are estimated to be turned on if the optimal read bias R2OP is applied to target memory cells, when the respective numbers of memory cells corresponding to the threshold voltage distributions D1' to D4' are equal to one another. Accordingly, the reference cell number may be determined according to what a target read bias and the target threshold voltage distributions are. For example, in FIG. 5, the reference cell number for the target threshold voltage distributions D2' and D3' may be "200."

The appropriateness determination unit 110A may determine the appropriateness of the target red bias R2F based on the determination cell number and the reference cell number. For example, the appropriateness determination unit 110A may determine that the target read bias R2F is appropriate, when an error rate Pr_DF calculated based on the determination cell number and the reference cell number using the following Equation 1, is included within a predetermined tolerance range.

$$Pr\_DF = \text{(determination cell \#−reference cell \#)/target memory cell \# per threshold voltage distribution} \quad (1)$$

The smaller the error rate Pr_DF is, the closer the target read bias R2F may be to the optimal read bias R2OP.

In the example illustrated in FIG. 5, the appropriateness determination unit 110A may determine the error rate Pr_DF of the target read bias R2F as "0.9," since the determination cell number is 290, the reference cell number is 200, and the number of the target memory cells per threshold voltage distribution is 100. The appropriateness determination unit 110A may determine that the target read bias R2F is included within the predetermined tolerance range when the error rate Pr_DF is less than "0.3". Therefore, at this time, the appropriateness determination unit 110A may determine that the target read bias R2F is not included within the predetermined tolerance range with respect to the optimal read bias R2OP, and determine that the target read bias R2F is inappropriate for the target threshold voltage distributions D2' and D3'. Accordingly, the read bias determination unit 120A may repeat a read bias determination operation to determine a new read bias instead of the target read bias R2F which is erroneously determined.

The appropriateness determination unit 110A should determine the reference cell number, and the reference cell number may be determined based on the numbers of target memory cells respectively corresponding to the threshold voltage distributions D1' to D4'. Therefore, in the case where data are stored in the nonvolatile memory device 200A after being randomized, the reference cell number may be determined as described above, on the assumption that the respective threshold voltage distributions D1' to D4' correspond to the same number of target memory cells.

Figure 6A:
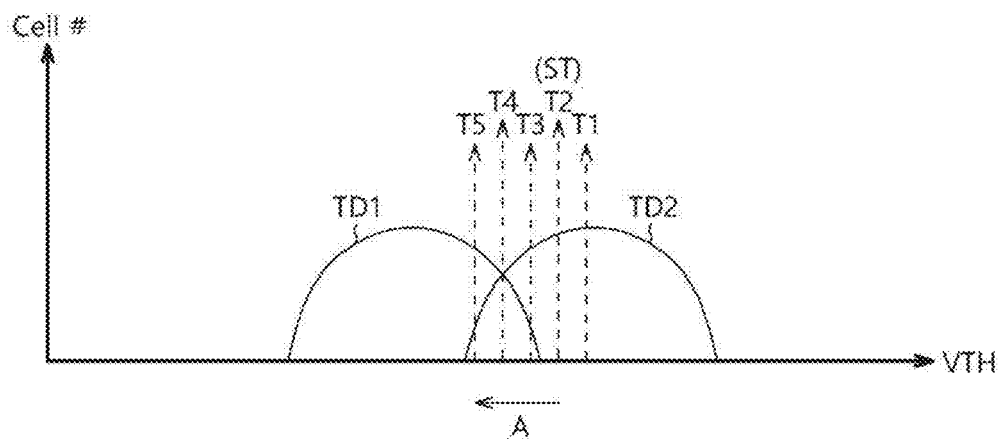
FIG. 6A is a diagram illustrating an example of a read bias determination operation based on a gradient descent algorithm.

FIG. 6A is a diagram illustrating an example of a read bias determination operation based on the gradient descent algorithm GD_ARG. FIG. 6A illustrates how a read bias determination operation based on the gradient descent algorithm GD_ARG is performed for optional target threshold voltage distributions TD1 and TD2.

Referring to FIG. 6A, the read bias determination operation based on the gradient descent algorithm GD_ARG may be performed in such a way as to find a voltage level corresponding to a position where a gradient is "0," in the optional target threshold voltage distributions TD1 and TD2 which are adjacent to each other.

In detail, when the read bias determination operation is performed, data may be read based on at least 3 test biases T1 to T3 including a test bias T2 as a predetermined start bias ST and adjacent biases T1 and T3 of the test bias T2. The numbers of memory cells corresponding to the intervals between the test biases T1 to T3 may be calculated through the read data. Based on calculation results, the gradient of the target threshold voltage distribution TD2 corresponding to the intervals between the test biases T1 to T3 may be estimated.

Then, test biases T4 and T5 may be additionally selected in a direction A where the magnitude of a gradient with respect to the start bias ST decreases, and the gradient of the target threshold voltage distribution TD2 corresponding to the intervals between the test biases T3 to T5 may be estimated in the same manner. Selection of test biases and estimation of a gradient may be continued while changing a selection direction, until a position where a gradient is "0" is found in the target threshold voltage distribution TD2. When a position where a gradient is "0" is found, an intermediate test bias among 3 test biases which are selected last may be selected as a new read bias. For example, in FIG. 6A, the test bias T4 may be selected as a new read bias.

Figure 6B:
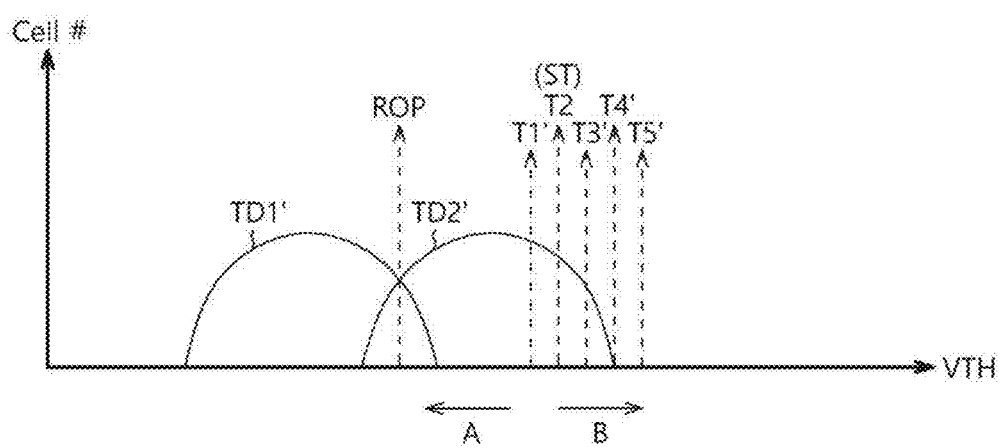
FIG. 6B is a diagram illustrating an example of a read bias determination operation based on a gradient descent algorithm that malfunctioned.

In such a gradient descent algorithm GD_ARG, the position of the start bias ST may exert an importance influence on a result. As shown in FIG. 6B, depending on the position of the start bias ST, the gradient descent algorithm GD_ARG may malfunction.

FIG. 6B is a diagram illustrating an example of a read bias determination operation based on the gradient descent algorithm GD_ARG that malfunctioned.

Referring to FIG. 6B, first, it is assumed that, while the target threshold voltage distributions TD1 and TD2 move to target threshold voltage distributions TD1' and TD2', respectively, a start bias ST is the test bias T2 in the same manner as in FIG. 6A. Such a situation may correspond to a case where the position of the predetermined start bias ST becomes inappropriate by substantial movement of the target threshold voltage distributions TD1 and TD2.

When a read bias determination operation is performed, in the same manner as described with reference to FIG. 6A, the gradient of the target threshold voltage distribution TD2' will be started to be estimated based on at least 3 test biases T1', T2 and T3' including the test bias T2 as the predetermined start bias ST and adjacent biases T1' and T3' of the test bias T2. Selection of test biases and estimation of a gradient may be performed in a direction B where the magnitude of a gradient with respect to the start bias ST decreases. Therefore, test biases T4' and T5' may be selected, and as a result, the test bias T4' may be erroneously determined as a new read bias for the target threshold voltage distributions TD1' and TD2'.

In this way, malfunction of the gradient descent algorithm GD_ARG which is executed in the direction B opposite to the direction A where an optimal read bias ROP is positioned may be caused when the start bias ST is substantially remote from the optimal read bias ROP. Of course, while the position of the start bias ST may be erroneously set from the beginning, even when the start bias ST is set appropriately by considering expected movements of the target threshold voltage distributions TD1 and TD2, the position of the start bias ST may become inappropriate as the target threshold voltage distributions TD1 and TD2 move substantially.

However, the appropriateness determination unit 110A according to the present embodiment may determine appropriateness of a read bias through a simple method even though a read bias determination operation malfunctions, and thereby cause a read bias determination operation to be performed again.

Meanwhile, the controller 100A may estimate a direction where the start bias ST is positioned with respect to the optimal read bias ROP, based on an error rate Pr_DF calculated in an appropriateness determination operation. For example, when the error rate Pr_DF is a positive number, it may be estimated that the start bias ST is positioned rightward remotely from the optimal read bias ROP as shown in FIG. 6B. Therefore, the controller 100A may move the start bias ST in the direction A that is appropriate. Consequently, the read bias determination unit 120A may repeat a read bias determination operation based on a new start bias.

Figure 7:
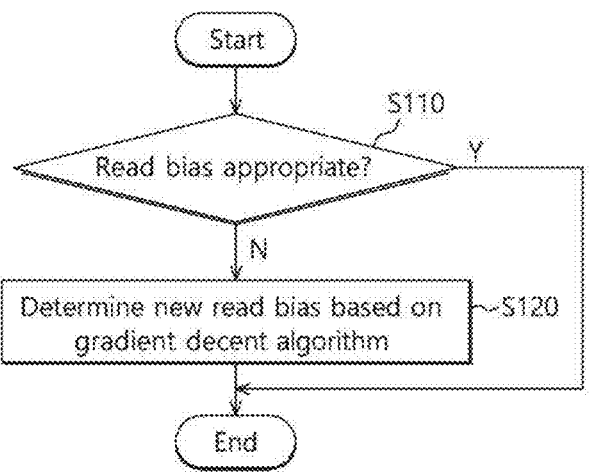
FIG. 7 is a flow chart illustrating a method for operating the data storage device of FIG. 1.

FIG. 7 is a flow chart illustrating a method for operating the data storage device 10A of FIG. 1.

Referring to FIG. 7, at step S110, the appropriateness determination unit 110A may determine appropriateness of a target read bias for target threshold voltage distributions. The appropriateness determination unit 110A may determine appropriateness of the target read bias by calculating the error rate of the target read bias with respect to an optimal read bias of the target threshold voltage distributions and determining, based on the error rate, whether the target read bias lies within a tolerance range for the optimal read bias. When it is determined that the target read bias is appropriate, the process may be ended. However, when it is determined that the target read bias is inappropriate, the process may proceed to step S120.

At step S120, the read bias determination unit 120A may determine a new read bias for the target threshold voltage distributions, based on the gradient descent algorithm GD_ARG. The read bias determination unit 120A may determine a new read bias in such a way as to find a voltage level corresponding to a position where a gradient is "0" in the target threshold voltage distributions, starting from a predetermined start bias.

Figure 8:
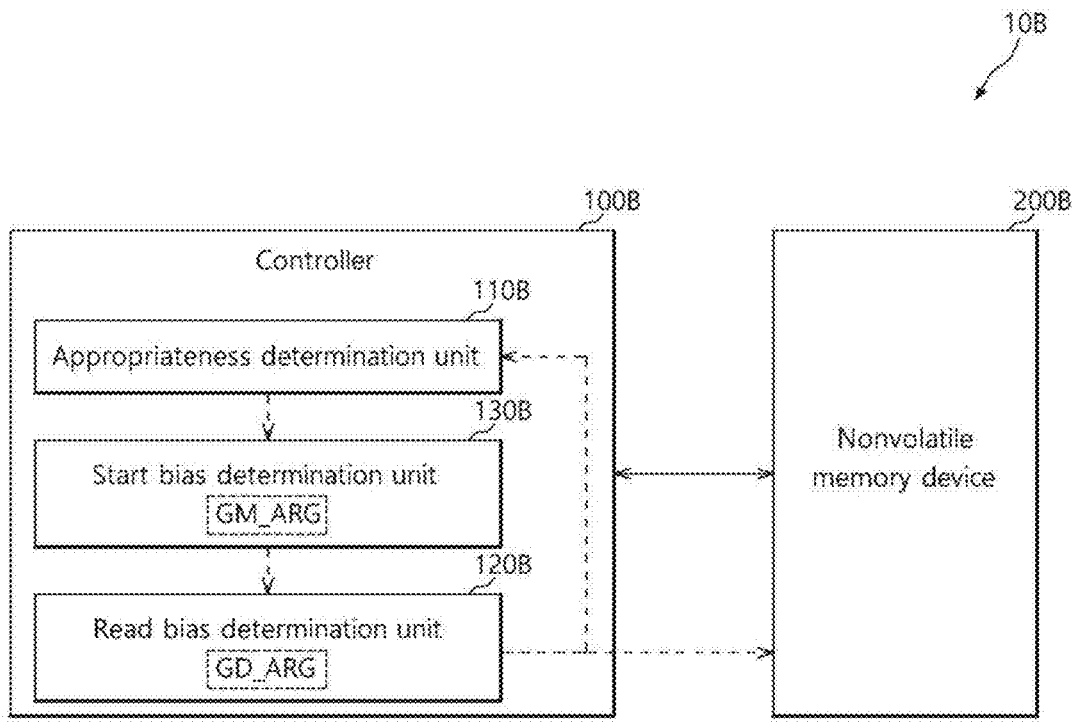
FIG. 8 is a block diagram illustrating a data storage device in accordance with another embodiment of the present invention.

FIG. 8 is a block diagram illustrating a data storage device 10B in accordance with another embodiment of the present invention.

Referring to FIG. 8, the data storage device 10B may include a controller 100B and a nonvolatile memory device 200B. The controller 100B may include an appropriateness determination unit 110B, a read bias determination unit 120B, and a start bias determination unit 130B. The appropriateness determination unit 110B and the read bias determination unit 120B may be configured and operate in substantially the same manner as the appropriateness determination unit 110A and the read bias determination unit 120A of FIG. 1, respectively, and thus, detailed descriptions thereof will be omitted herein.

The start bias determination unit 130B may determine a start bias to be used in a read bias determination operation for target threshold voltage distributions, when the appropriateness determination unit 110B determines a target read bias to be inappropriate for the target threshold voltage distributions. In some embodiments, the start bias determination unit 130B may determine a start bias based on a Gaussian modeling algorithm GM_ARG. In particular, the start bias determination unit 130B may determine a start bias to be close to an optimal read bias of the target threshold voltage distributions. Namely, as described above with reference to FIG. 6B, since the gradient descent algorithm GD_ARG may malfunction when a start bias is substantially remote from the optimal read bias of the target threshold voltage distributions, the start bias determination unit 130B may determine a start bias to be close to the optimal read bias.

In detail, the start bias determination unit 130B may determine an average threshold voltage of a first target threshold voltage distribution selected between the target threshold voltage distributions, based on a Gaussian distribution function, and determine a start bias based on the average threshold voltage and an estimated width of the first target threshold voltage distribution.

Hence, the start bias determination unit 130B may determine a more appropriate start bias to be used in a read bias determination operation. The read bias determination unit 120B may perform a read bias determination operation based on the gradient descent algorithm GD_ARG by using the determined start bias.

The start bias determination unit 130B may perform a multitude of times a start bias determination operation based on the Gaussian modeling algorithm GM_ARG for the same target threshold voltage distributions while time passes. Due to this, the start bias determination unit 130B may calculate a plurality of start biases for the same target threshold voltage distributions. Therefore, according to an embodiment, the start bias determination unit 130B may determine the average of the start biases calculated for the same target threshold voltage distributions while time passes, as a new start bias.

Figure 9A:
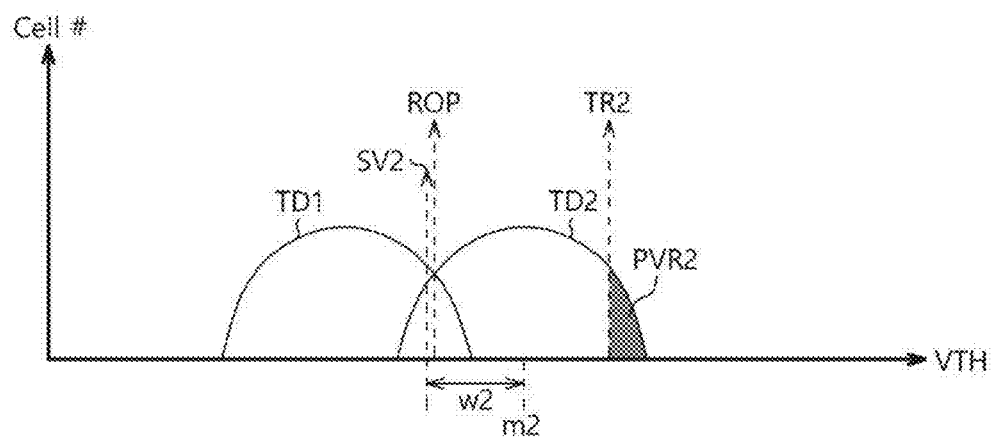
FIGS. 9A and 9B are diagrams illustrating examples of a method for the start bias determination unit of FIG. 8 to determine a start bias for a read bias determination operation for target threshold voltage distributions.

FIG. 9A is a diagram illustrating a method for the start bias determination unit 130B of FIG. 8 to determine a start bias SV2 for a read bias determination operation for target threshold voltage distributions TD1 and TD2.

The start bias determination unit 130B may calculate an average threshold voltage m2 of the target threshold voltage distribution TD2 as any one selected between the target threshold voltage distributions TD1 and TD2. The target threshold voltage distribution TD2 in which the average threshold voltage m2 is calculated may be a target threshold voltage distribution in which a reference read bias TR2 is positioned, between the target threshold voltage distributions TD1 and TD2. The start bias determination unit 130B may determine the average threshold voltage m2 of the target threshold voltage distribution TD2 based on the area rate of a partial distribution PVR2 which is formed by the reference read bias TR2 in the selected target threshold voltage distribution TD2. The area rate of the partial distribution PVR2 may be the ratio of the partial distribution PVR2 with respect to the target threshold voltage distribution TD2. That is to say, the area rate of the partial distribution PVR2 may be the probability of a target memory cell to be present in the partial distribution PVR2 of the target threshold voltage distribution TD2.

Meanwhile, for decreasing an overhead in calculation of the area rate, the start bias determination unit 130B may consider a target read bias for which the appropriateness determination unit 110B determines appropriateness, as the reference read bias TR2, and calculate the area rate from the error rate Pr_DF of the target read bias. For example, since the target read bias of which error rate Pr_DF is calculated as a positive number is positioned rightward of an optimal read bias ROP, in the target threshold voltage distribution TD2, the corresponding target read bias may be considered as the reference read bias TR2. The relationship between an area rate Pr_PVR2 of the partial distribution PVR2 and the error rate Pr_DF may be provided by the following Equation 2.

$$Pr\_PVR2 = 1 - Pr\_DF, \text{ where } Pr\_DF > 0 \qquad (2)$$

Then, the start bias determination unit 130B may determine the average threshold voltage m2 of the target threshold voltage distribution TD2 based on the area rate Pr_PVR2 of the partial distribution PVR2. For example, the target threshold voltage distribution TD2 may be expressed as the following Equation 3 by being Gaussian-modeled. In the following Equation 3, "vth" may be a value on a threshold voltage axis VTH, and "σ" may be the variance of the target threshold voltage distribution TD2.

$$TD2 = \frac{1}{2\sqrt{\pi}\,\sigma} e^{-\frac{(vth-m2)^2}{2\sigma^2}} \qquad (3)$$

Accordingly, the following Equation 4 as an integral equation may be established for the area rate Pr_PVR2 of the partial distribution PVR2 or the error rate Pr_DF of the target read bias TR2.

$$Pr\_PVR2 = 1 - Pr\_DF = \int_{R2F}^{\infty} \frac{1}{2\sqrt{\pi}\,\sigma} e^{-\frac{(vth-m2)^2}{2\sigma^2}} dvth \qquad (4)$$

Therefore, if the variance σ of the target threshold voltage distribution TD2 is set as an appropriate constant, the average threshold voltage m2 may be determined from the Equation 4.

According to an embodiment, the average threshold voltage m2 may be conveniently determined from the area rate Pr_PVR2 of the partial distribution PVR2 by using the characteristic of a Q function without performing the calculation of the Equation 4.

The target threshold voltage distribution TD2 may be standardized as a standard Gaussian distribution, and a standardized target threshold voltage distribution STD2 may be converted into the following Equation 5.

$$STD2 = \frac{1}{2\sqrt{\pi}} e^{-\frac{y^2}{2}} \qquad (5)$$

A Q function expressed by the following Equation 6 represents a probability of a random variable of a standard Gaussian distribution to have a value larger than "z."

$$Q(z) = \int_{z}^{\infty} \frac{1}{2\sqrt{\pi}} e^{-\frac{y^2}{2}} dy \qquad (6)$$

wherein Z may be provided by the following equation.

$$z = \frac{TR2 - m2}{\sigma} \quad (7)$$

Accordingly, the following Equation 8 may be established based on Equations 4, 6 and 7.

$$Q(z)=Pr\_PVR2\sigma \quad (8)$$

Since a value of Q(z) for a value of z is known, the value of z may be known when the value of Q(z) is known. Therefore, finally, the following Equation 9 may be derived through the Equation 7 and the Equation 8.

$$m2=TR2-Q^{-1}(Pr\_PVR2)\sigma \quad (9)$$

Wherein, $Q^{-1}$ is the inverse function of Q(z).

Through the Equations 2 and 9, the following Equation 10 for the error rate Pr_DF of the target read bias TR2 may be derived.

$$m2=TR2-Q^{-1}(1-Pr\_DF)\tau=TR2+Q^{-1}(Pr\_DF)\tau, \text{ where } Pr\_DF>0 \quad (10)$$

Figures 10, 11:
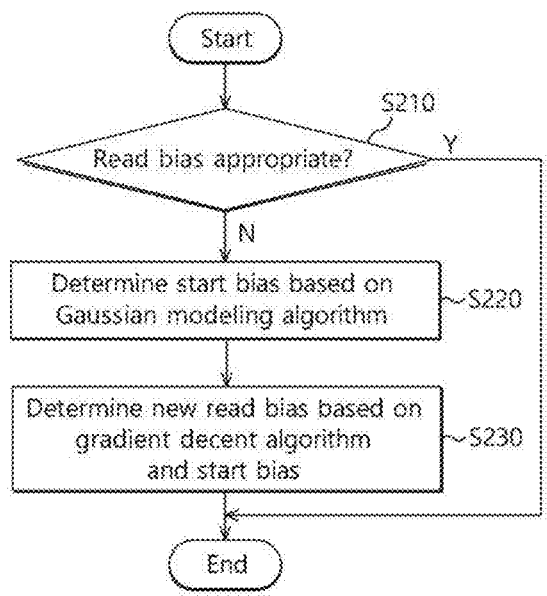
FIG. 10 is a diagram illustrating an example of a table in which values of the inverse function of a Q function for predetermined area rates are arranged.
FIG. 11 is a flow chart illustrating an example of a method for operating the data storage device of FIG. 8.

FIG. 10 is a diagram illustrating an example of a table in which values of the inverse function $Q^{-1}$ of the Q function for predetermined area rates Pr_PVR are arranged.

Referring to FIG. 10, the start bias determination unit 130B may extract a value of the inverse function $Q^{-1}$ of the Q function corresponding to the area rate Pr_PVR2 of the partial distribution PVR2, by referring to the table of FIG. 10. The start bias determination unit 130B may efficiently calculate the average threshold voltage m2 by calculating the Equation 9 based on the reference read bias TR2, the value of the inverse function $Q^{-1}$ of the Q function and the predetermined variance σ.

Meanwhile, because a variation in the value of the inverse function $Q^{-1}$ of the Q function for the area rate Pr_PVR is large near the tail of a standard Gaussian distribution, for decreasing errors, the table may include area rates Pr_PVR and corresponding values of the inverse function $Q^{-1}$ of the Q function, which are finely set from 0 to a predetermined value, for example, "0.5."

Even though the table is constructed for only area rates Pr_PVR less than 0.5, the controller 100A may easily calculate values of the inverse function $Q^{-1}$ of the Q function for area rates Pr_PVR equal to or greater than 0.5, based on symmetry of the Q function. According to an embodiment, the table may be constructed to include values corresponding to area rates Pr_PVR equal to or greater than 0.5.

Referring again to FIG. 9A, the start bias determination unit 130B may set the start bias SV2 based on the average threshold voltage m2 and an estimated width w2 of the target threshold voltage distribution TD2. The start bias SV2 may be set as the average threshold voltage m2 is moved to the vicinity of the left tail of the target threshold voltage distribution TD2 by the estimated width w2. The start bias SV2 may be positioned close to the optimal read bias ROP by being moved to the vicinity of the left tail of the target threshold voltage distribution TD2. The start bias SV2 may be finally expressed by the following Equation 11.

$$SV2=TR2-Q^{-1}(Pr\_PVR2)\sigma+Q^{-1}(0.999)\sigma \quad (11)$$

That is to say, in the Equation 11, the last term is to move the average threshold voltage m2 to the vicinity of the left tail of the target threshold voltage distribution TD2, and may correspond to the estimated width w2. According to an embodiment, in the last term of the Equation 11, an appropriate value may be selected, instead of "0.999," as the input value of the $Q^{-1}$ function, depending on the shape of the target threshold voltage distribution TD2.

The Equation 11 may be expressed as the following Equation 12 using the error rate Pr_DF of the target read bias TR2, based on the Equation 2.

$$SV2=TR2+Q^{-1}(Pr\_DF)\sigma+Q^{-1}(0.999)\sigma, \text{ where } Pr\_DF>0 \quad (12)$$

Summarizing these, the start bias SV2 may be set to be close to the optimal read bias ROP of the target threshold voltage distributions TD1 and TD2. Therefore, the gradient descent algorithm GD_ARG based on the start bias SV2 may appropriately determine a new read bias in the vicinity of the optimal read bias ROP without going in a wrong direction.

Figure 9B:
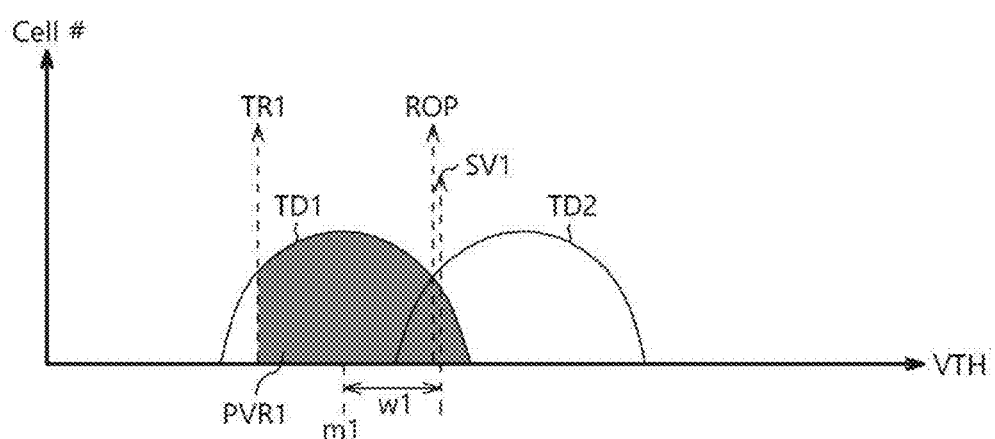

FIG. 9B is a diagram illustrating another example of a method for the start bias determination unit 130B of FIG. 8 to determine a start bias SV1 for a read bias determination operation for target threshold voltage distributions TD1 and TD2. In FIG. 9B, a reference read bias TR1 may be positioned leftward of the optimal read bias ROP unlike that the reference read bias TR2 of FIG. 9A is positioned rightward of the optimal read bias ROP. In other words, FIG. 9B may be applied in the case where a target read bias of which appropriateness is determined by the appropriateness determination unit 110B is positioned leftward of the optimal read bias ROP, that is, when the error rate Pr_DF of the target read bias is calculated as a negative number. In this case, the relationship between an area rate Pr_PVR1 of a partial distribution PVR1 and the error rate Pr_DF may be the same as the following Equation 13.

$$Pr\_PVR1=-Pr\_DF, \text{ where } Pr\_DF<0 \quad (13)$$

Then, the start bias SV1 may be determined according to the following Equation 14.

$$SV1=TR1-Q^{-1}(Pr\_PVR1)\sigma-Q^{-1}(0.999)\sigma \quad (14)$$

The Equation 14 may be expressed as the following Equation 15 using the error rate Pr_DF of the target read bias TR1, based on the Equation 13.

$$SV1=TR1+Q^{-1}(1+Pr\_DF)\sigma-Q^{-1}(0.999)\sigma, \text{ where } Pr\_DF<0 \quad (15)$$

In the Equation 15, the first and second terms may determine is an average threshold voltage m1 of the target threshold voltage distribution TD1 positioned leftward of the optimal read bias ROP. In the Equation 15, the last term may move the average threshold voltage m1 of the target threshold voltage distribution TD1 to the vicinity of a right tail by an estimated width w1.

Referring back to FIG. 8, according to an embodiment, the controller 100B may perform a read bias determination operation regardless of an appropriateness determination result for a target read bias. For example, when a predetermined condition is satisfied, the controller 100B may perform a read bias determination operation even though an appropriateness determination operation for a target read bias is omitted or a target read bias is determined to be appropriate, in an appropriateness determination operation. For example, the predetermined condition may include elapse of a predetermined time, an increase in a data error rate and occurrence of a read failure. In this case, although an error rate of a target read bias to be used in a start bias determination operation does not exist if the controller 100B does not perform an appropriateness determination operation, the controller 100B may calculate the error rate of a target read bias in the same manner as in an appropriateness determination operation. Then, the controller 100B may perform a start bias determination operation by using the error rate according to the above-described method, and complete a read bias determination operation.

FIG. 11 is a flow chart illustrating an example of a method for operating the data storage device 1013 of FIG. 8.

Referring to FIG. 11, at step S210, the appropriateness determination unit 110B may determine appropriateness of a target read bias for target threshold voltage distributions. When it is determined that the target read bias is appropriate, the process may be ended. However, when it is determined that the target read bias is inappropriate, the process may proceed to step S220.

At the step S220, the start bias determination unit 130B may determine a start bias to be used in a read bias determination operation for the target threshold voltage distributions, based on the Gaussian modeling algorithm GM_ARG. The start bias determination unit 130B may determine a start bias to be close to an optimal read bias of the target threshold voltage distributions. The start bias determination unit 130B may determine an average threshold voltage of a first target threshold voltage distribution selected between the target threshold voltage distributions, based on a Gaussian distribution function, and determine a start bias based on the average threshold voltage and an estimated width of the first target threshold voltage distribution.

At step S230, the read bias determination unit 120B may determine a new read bias for the target threshold voltage distributions, based on the gradient descent algorithm GD_ARG and the start bias.

Figure 12:
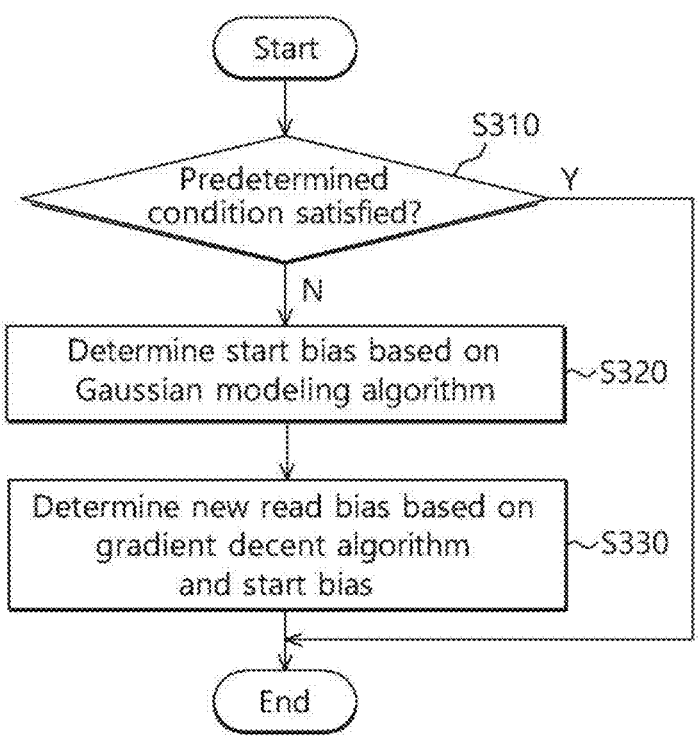
FIG. 12 is a flow chart illustrating another example of a method for operating the data storage device of FIG. 8.

FIG. 12 is a flow chart illustrating another example of a method for operating the data storage device 1013 of FIG. 8.

Referring to FIG. 12, at step S310, the controller 100B may determine whether or not a predetermined condition is satisfied. For example, the predetermined condition may include the elapse of a predetermined time, an increase in a data error rate and occurrence of a read failure. When the predetermined condition is not satisfied, the process may be ended. However, when the predetermined condition is satisfied, the process may proceed to step S320.

At the step S320, the start bias determination unit 130B may determine a start bias for a read bias determination operation for target threshold voltage distributions, based on the Gaussian modeling algorithm GM_ARG. The start bias determination unit 130B may calculate the error rate of a target read bias for the target threshold voltage distributions, and determine a start bias based on the error rate and a Gaussian distribution function.

At step S330, the read bias determination unit 120B may determine a new read bias for the target threshold voltage distributions, based on the gradient descent algorithm GD_ARG and the start bias.

Figure 13:
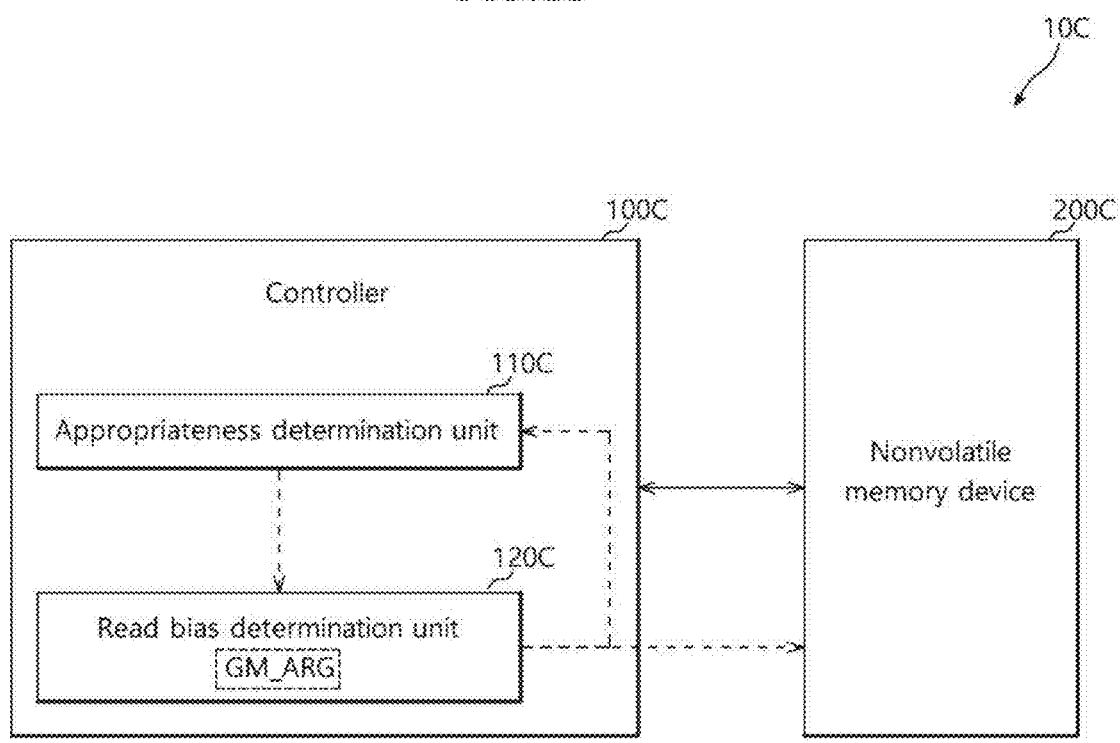
FIG. 13 is a block diagram illustrating a data storage device in accordance with further embodiment of the present invention.

FIG. 13 is a block diagram illustrating a data storage device 10C, in accordance with yet another embodiment of the present invention.

Referring to FIG. 13, the data storage device 10C may include a controller 100C and a nonvolatile memory device 200C. The controller 100C may include an appropriateness determination unit 110C and a read bias determination unit 120C. The appropriateness determination unit 110C may be configured and operate in substantially the same manner as the appropriateness determination unit 110A of FIG. 1, and thus, detailed descriptions thereof will be omitted herein.

The read bias determination unit 120C may perform a read bias determination operation for target threshold voltage distributions. In some embodiments, the read bias determination unit 120C may perform the read bias determination operation based on a Gaussian modeling algorithm GM_ARG. Determination of a read bias based on the Gaussian modeling algorithm GM_ARG may be performed in a manner substantially similar to the above-described determination of a start bias based on the Gaussian modeling algorithm GM_ARG. For example, a voltage level determined as a start bias based on the Gaussian modeling algorithm GM_ARG in the data storage device 1013 of FIG. 8 may be determined as a read bias in the data storage device 10C. The reason to this resides in that, because, in the data storage device 1013 of FIG. 8, a start bias is determined to be close to the optimal read bias of target threshold voltage distributions, the start bias may be used as a read bias by itself.

The read bias determination unit 120C may perform a multitude of times a read bias determination operation based on the Gaussian modeling algorithm GM_ARG for the same target threshold voltage distributions while time passes. Due to this, the read bias determination unit 120C may calculate a plurality of read biases for the same target threshold voltage distributions. Therefore, according to an embodiment, the read bias determination unit 120C may determine the average of the read biases calculated for the same target threshold voltage distributions while time passes, as a new read bias.

Figure 14:
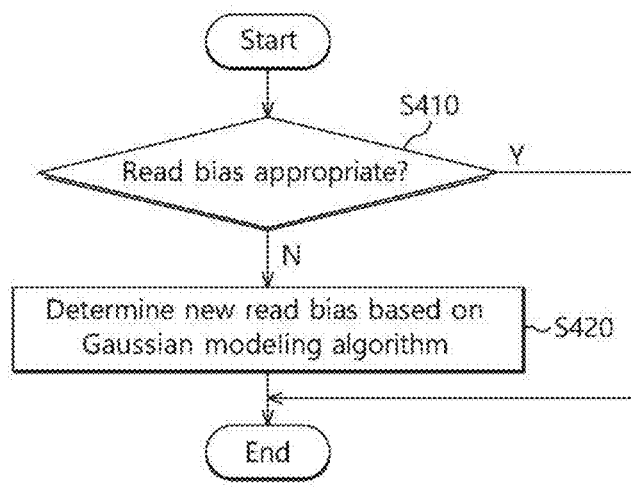
FIG. 14 is a flow chart illustrating a method for operating the data storage device of FIG. 13.

FIG. 14 is a flow chart illustrating a method for operating the data storage device 10C of FIG. 13.

Referring to FIG. 14, at step S410, the appropriateness determination unit 110C may determine the appropriateness of a target read bias for target threshold voltage distributions.

If the determination in step S410 is that the target read bias is not appropriate for the target threshold voltage distributions, then the process proceeds to step S420. At step S420, the read bias determination unit 120C determines a new read bias for the target threshold voltage distributions, based on the Gaussian modeling algorithm GM_ARG. The read bias determination unit 120C may determine an average threshold voltage of a first target threshold voltage distribution selected between the target threshold voltage distributions, based on a Gaussian distribution function, and determine a read bias based on the average threshold voltage and an estimated width of the first target threshold voltage distribution. If the determination in step S410 is that the target read bias is appropriate for the target threshold voltage distributions then the process is terminated.

Figure 15:
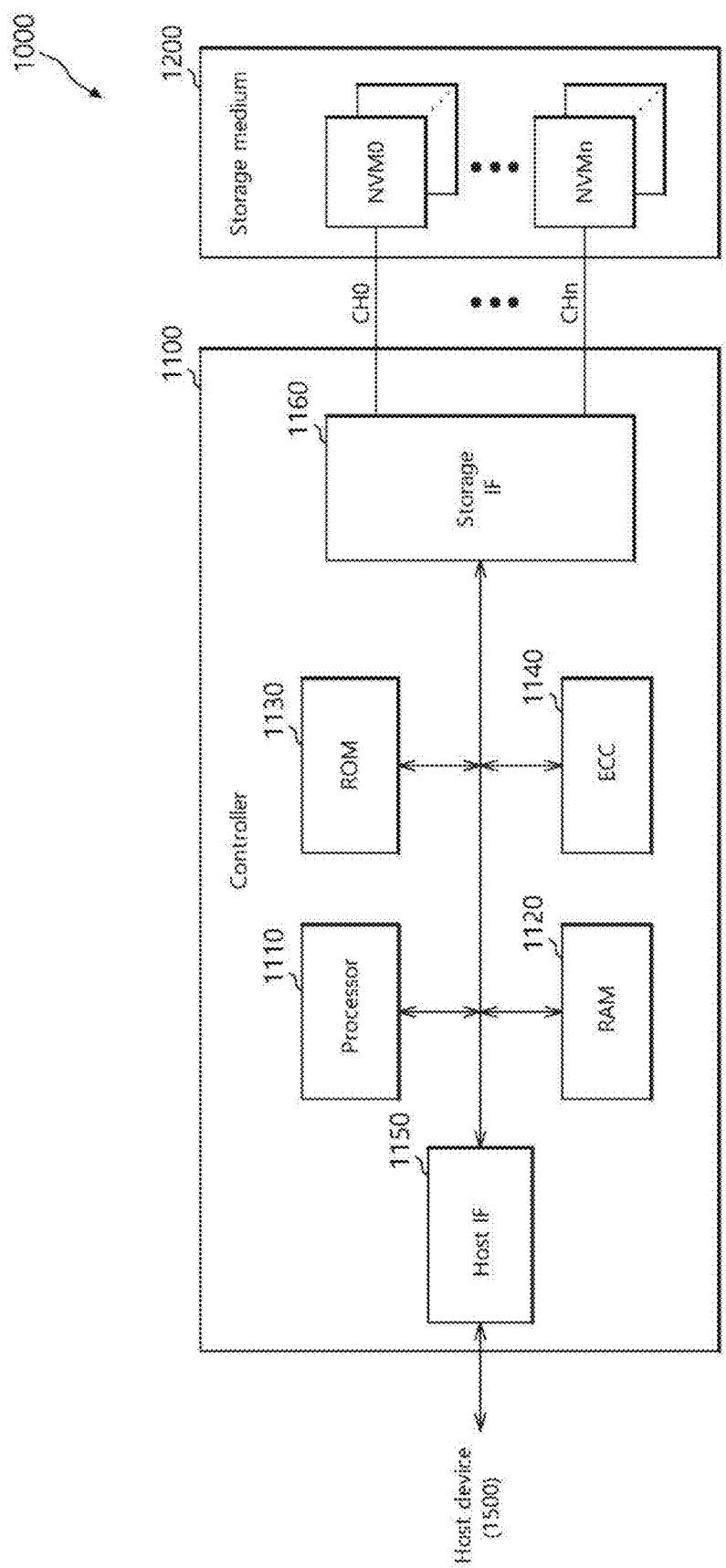
FIG. 15 is a block diagram illustrating a solid state drive (SSD) in accordance with an embodiment of the present invention.

FIG. 15 illustrates a solid state drive (SSD) 1000, in accordance with an embodiment of the present invention.

Referring to FIG. 15, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160, operatively coupled via an internal bus 1170.

The controller 1100 may operate substantially similarly to any one among the controllers 100A to 100C shown in FIGS. 1, 8 and 13. The controller 1100 may determine appropriateness of a target read bias for target threshold voltage distributions. The controller 1100 may determine a start bias to be used in a read bias determination operation for the target threshold voltage distributions, based on a Gaussian modeling algorithm. The controller 1100 may determine a new read bias for the target threshold voltage distributions, based on a gradient descent algorithm and the start bias. The controller 1100 may determine a new read bias for the target threshold voltage distributions, based on a Gaussian modeling algorithm.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

A storage medium 1200 may include a plurality of nonvolatile memory devices NVM0 to NVMn. Each of the plurality of nonvolatile memory devices NVM0 to NVMn may perform a write operation and a read operation according to control of the controller 1100.

Figure 16:
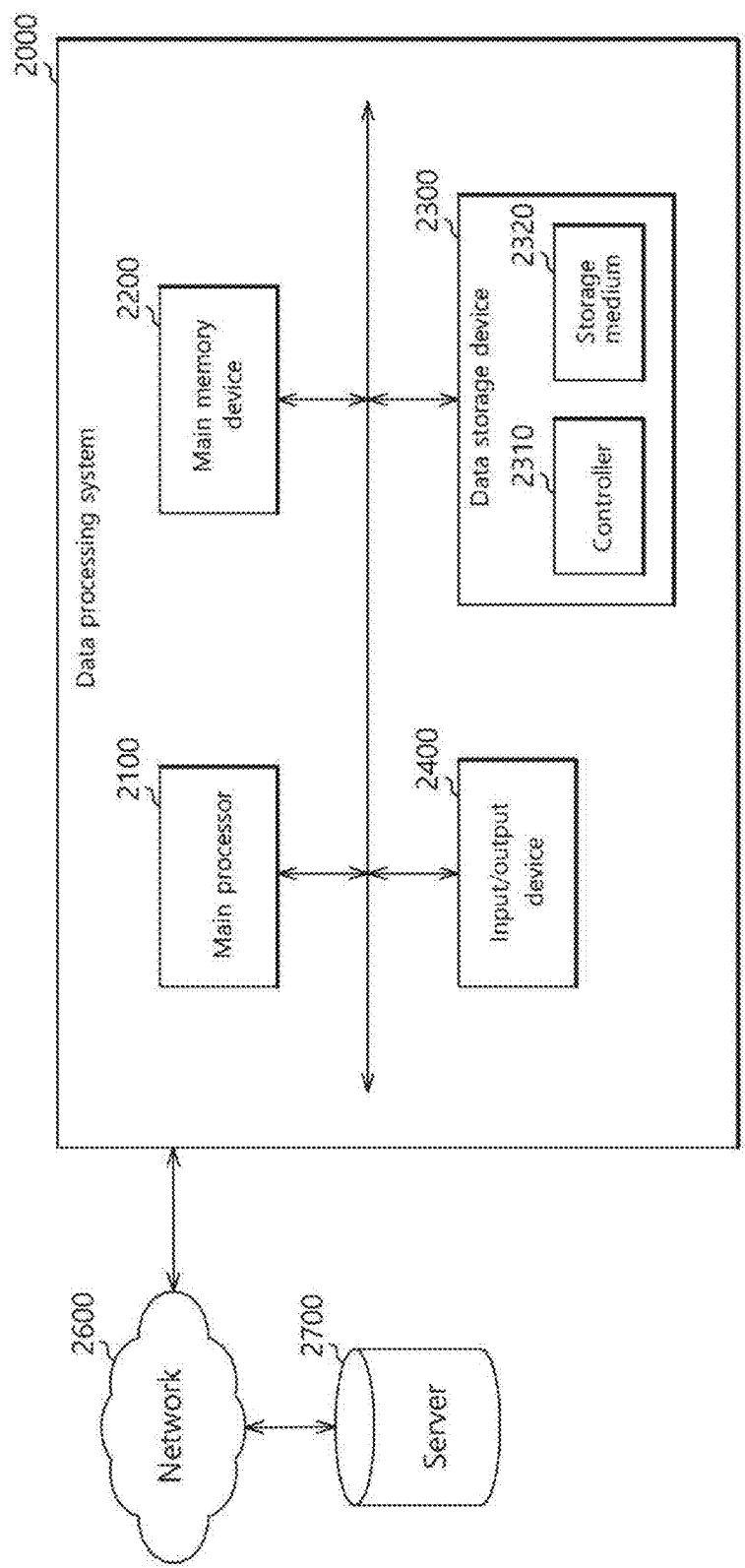
FIG. 16 is a block diagram illustrating a data processing system including a data storage device, in accordance with an embodiment of the present invention.

FIG. 16 is a block diagram illustrating a data processing system 2000 including a data storage device, according to an embodiment of the present invention.

Referring to FIG. 16, the data processing system 2000 may include a computer, a laptop, a netbook, a smart phone, a digital television (TV), a digital camera, a navigator, etc. The data processing system 2000 may include a main processor 2100, a main memory device 2200, a data storage device 2300, and an input/output device 2400.

The main processor 2100 may control general operations of the data processing system 2000. The main processor 2100 may be a central processing unit such as a microprocessor. The main processor 2100 may execute software such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to any one among the data storage devices 10A to 10C of FIGS. 1, 8 and 13.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments.

What is claimed is:

1. A method for operating a data storage device, comprising:
    determining appropriateness of a first read bias for adjacent target threshold voltage distributions among threshold voltage distributions for a plurality of memory cells;
    if it is determined that the first read bias is inappropriate, determining an argument value of an inverse function of a Q function by using an error rate;
    determining a start bias corresponding to the target threshold voltage distributions, based on the argument value and the inverse function; and
    determining a second read bias based on the start bias,
    wherein the error rate is calculated based on a difference between a number of memory cells outputting a predetermined value in response to the first read bias and a reference number.

2. The method according to claim 1, wherein the determining of the appropriateness of the first read bias comprises:
    determining the number of memory cells which have threshold voltages lower than the first read bias, among the plurality of memory cells; and
    calculating the error rate based on the number of memory cells and the reference number corresponding to the target threshold voltage distributions.

3. The method according to claim 2, wherein the determining of the number of memory cells comprises:
    obtaining data read from the memory cells based on the first read bias; and
    determining a number of bits having the predetermined value, included in the data.

4. The method according to claim 1, wherein the determining of the start bias comprises:
    determining an average threshold voltage of a first target threshold voltage distribution of the target threshold voltage distributions, based on the error rate and the inverse function; and
    determining the start bias based on the average threshold voltage and an estimated width of the first target threshold voltage distribution.

5. The method according to claim 4, wherein the determining of the average threshold voltage comprises:
    determining the average threshold voltage by applying the error rate to an integral equation for the Gaussian distribution function.

6. The method according to claim 1, wherein the determining of the second read bias comprises:

determining the second read bias by estimating a gradient of a target threshold voltage distribution in which the start bias is positioned, based on a gradient descent algorithm.

7. The method according to claim 1, wherein the determining of the second read bias comprises:
   determining the start bias as the second read bias.

8. A method for operating a data storage device, comprising:
   determining an average threshold voltage of a first target threshold voltage distribution of adjacent target threshold voltage distributions among threshold voltage distributions of a plurality of memory cells by Gaussian modeling the first target threshold voltage distribution;
   determining a start bias of a gradient descent algorithm; and
   determining a read bias for the target threshold voltage distributions by estimating a gradient of a target threshold voltage distribution in which the start bias is positioned, based on the gradient descent algorithm.

9. The method according to claim 8, wherein the determining of the start bias comprises
   determining the start bias by moving the average threshold voltage to a tail of the first target threshold voltage distribution by an estimated width of the first target threshold voltage distribution.

10. The method according to claim 8, wherein the determining of the average threshold voltage comprises:
    determining the average threshold voltage by determining an error rate of a first read bias for the target threshold voltage distributions and applying the error rate to an integral equation for the Gaussian distribution function.

11. The method according to claim 8, wherein the determining of the average threshold voltage comprises:
    determining the average threshold voltage by calculating an error rate of a first read bias for the target threshold voltage distributions and applying the error rate to an inverse function of a Q function.

* * * * *